United States Patent
Ellur

(10) Patent No.: US 10,678,634 B2
(45) Date of Patent: Jun. 9, 2020

(54) METHOD AND APPARATUS OF USING PARITY TO DETECT RANDOM FAULTS IN MEMORY MAPPED CONFIGURATION REGISTERS

(71) Applicant: Synopsys, Inc., Mountain View, CA (US)

(72) Inventor: Harsharaj Ellur, Bangalore (IN)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 16/253,088

(22) Filed: Jan. 21, 2019

(65) Prior Publication Data

US 2019/0227867 A1    Jul. 25, 2019

(30) Foreign Application Priority Data

Jan. 24, 2018 (IN) .............................. 201811002785

(51) Int. Cl.
*H03M 13/00* (2006.01)
*G06F 11/10* (2006.01)
(Continued)

(52) U.S. Cl.
CPC ...... *G06F 11/1004* (2013.01); *G01R 31/3177* (2013.01); *G01R 31/31724* (2013.01);
(Continued)

(58) Field of Classification Search
CPC .......... G06F 11/1004; G01R 31/31724; G01R 31/3177; G11C 29/022; H03M 13/11
See application file for complete search history.

(56) References Cited

U.S. PATENT DOCUMENTS 3,567,916 A    3/1971 Fullton
4,429,391 A *  1/1984 Lee ........................ H04Q 11/06
                                             714/800
(Continued)

OTHER PUBLICATIONS

Akbar, Muhammad Ali et al., article entitled "Self-repairing adder using fault localization", Microelectronics Reliability, 9 pages, Mar. 29, 2014.
(Continued)

*Primary Examiner* — Esaw T Abraham
(74) *Attorney, Agent, or Firm* — Bever, Hoffman & Harms, LLP

(57) ABSTRACT

A fault detection circuit generates a current parity bit for configuration data currently stored in a configuration register during each clock cycle, and compares the current parity bit with a previous parity bit generated during a previous clock cycle. An error signal is asserted when a mismatch is detected, indicating that the configuration register data erroneously changed due to a random hardware fault. Detection output circuitry is used to disable the error signal output driver using existing register input control signals, which prevents false error signals during intentional configuration data update operations. A parity input multiplexer, also controlled in response to the existing register input control signals, facilitates a parity update mode during intentional configuration data update operations, whereby updated parity values are generated for new/updated configuration data bytes before being written into the configuration registers. An optional self-test procedure verifies correct operation of the fault detection circuit.

15 Claims, 9 Drawing Sheets

(51) Int. Cl.
    *H03M 13/11* (2006.01)
    *G01R 31/3177* (2006.01)
    *H03K 3/037* (2006.01)
    *G01R 31/317* (2006.01)
    *G11C 29/02* (2006.01)
    *G11C 29/52* (2006.01)
    *H03K 19/17764* (2020.01)
    *H03K 19/1776* (2020.01)
    *H03M 13/09* (2006.01)
    *H03K 19/21* (2006.01)

(52) U.S. Cl.
    CPC ........... *G11C 29/022* (2013.01); *G11C 29/52* (2013.01); *H03K 3/037* (2013.01); *H03K 19/1776* (2013.01); *H03K 19/17764* (2013.01); *H03M 13/098* (2013.01); *H03M 13/11* (2013.01); *H03K 19/21* (2013.01)

(56) References Cited

U.S. PATENT DOCUMENTS

| | | | | |
|---|---|---|---|---|
| 4,727,548 | A | | 2/1988 | Dickey |
| 4,885,683 | A | * | 12/1989 | Coogan .................. G06F 3/0601 |
| | | | | 714/36 |
| 4,932,028 | A | * | 6/1990 | Katircioglu ......... G06F 11/0772 |
| | | | | 714/30 |
| 5,515,383 | A | * | 5/1996 | Katoozi ......... G01R 31/318385 |
| | | | | 714/732 |
| 5,537,425 | A | * | 7/1996 | Tsou ................... G06F 11/1016 |
| | | | | 714/799 |
| 5,784,393 | A | * | 7/1998 | Byers ..................... G06F 11/10 |
| | | | | 714/56 |
| 6,041,426 | A | * | 3/2000 | Qureshi ........... G01R 31/31813 |
| | | | | 365/201 |
| 7,734,173 | B2 | * | 6/2010 | Gilligan .................... H04L 1/08 |
| | | | | 398/16 |
| 8,428,708 | B1 | * | 4/2013 | White ..................... A61N 1/303 |
| | | | | 604/20 |
| 8,581,723 | B2 | * | 11/2013 | Schweitzer, III .... G01R 31/085 |
| | | | | 340/506 |
| 9,984,766 | B1 | * | 5/2018 | Becker ................... G11C 29/16 |
| 10,270,471 | B2 | * | 4/2019 | Lu ...................... H03M 13/1575 |

OTHER PUBLICATIONS

Hu, Jie et al., article entitled "In-Register Duplication: Exploiting Narrow-Width Value or Improving Register File Reliability", IEEE, 11 pages, Jun. 2006.

Nicolaidis, Michael articles entitled "Carry Checking/Parity Prediction Adders and ALUs", IDDD transactions on Very Large Scale Integration (VLSI) Systems, vol. 11, No. 1, Feb. 2003, 8 pages.

* cited by examiner

METHOD AND APPARATUS OF USING PARITY TO DETECT RANDOM FAULTS IN MEMORY MAPPED CONFIGURATION REGISTERS

RELATED APPLICATION

This application claims priority from Indian Provisional patent application serial number 201811002785 entitled "METHOD AND APPARATUS OF USING PARITY TO DETECT RANDOM FAULTS IN MEMORY MAPPED CONFIGURATION REGISTERS", which was filed on Jan. 24, 2018, and is incorporated by reference herein.

FIELD OF THE INVENTION

This invention relates to integrated circuit devices, and more particularly to integrated circuit devices that include configuration registers.

BACKGROUND OF THE INVENTION

Random hardware faults cause integrated circuit (IC) devices to malfunction in ways that are difficult to prevent. The phrase "random hardware faults" is typically used to reference a wide range of defects that cause individual gates of an IC device to fail, thereby producing erroneous data that causes the IC device to malfunction (i.e., to perform its intended functionality). Random hardware faults can either be age-related, or caused by events that cause IC devices to malfunction prematurely. Age-related random faults (e.g., transistor failures caused by the migration/merging of dopants within the semiconductor substrates) are expected to occur in all ICs eventually, and are easily anticipated and prevented by way of scheduled replacement of IC devices before the end of their operating lifetimes). In contrast, premature random faults cause IC devices to unexpectedly malfunction (e.g., fail entirely or continue to operate but generate erroneous data) during their expected operating lifetime. Due to the development of highly sophisticated EDA software tools, such as those produced by Synopsys, Inc., premature random faults rarely occur in modern IC devices, but can result from a wide range of accidental or randomly occurring causes, such as operation of ICs at temperatures outside of their specified operating ranges, or inadvertent exposure of ICs to hazardous environmental conditions such as radiation, which can cause damage due to alpha-particle hits. As used herein, the phrase "random hardware fault(s)" or "random fault(s)" is used primarily with reference to premature random faults.

Conventional fault detection circuits are utilized in some IC devices to detect random hardware faults where the consequences of premature random hardware faults can be significant. Premature random hardware faults occur at such a low probability that they are typically ignored in IC devices utilized in non-critical systems (e.g., systems in which the occurrence of random hardware faults does not pose a serious health risk to the user). However, the cost of incorporating fault detection circuits into IC devices typically outweighs potential liabilities when the IC circuits are utilized in critical (e.g., mission-critical or safety-critical) devices/systems, where erroneous data generated by the critical circuits/devices can cause significant financial loss and/or serious injury. When combined with fault mitigation circuitry that, for example, automatically reconfigures host IC circuit to re-route data from circuitry affected by a random hardware fault to known-good redundant circuitry, the use of fault detection circuits avoids the potentially significant consequences caused by premature random hardware faults.

A problem with existing conventional fault detection circuits is that they cannot be incorporated into configuration data paths utilized in some critical circuits/devices. That is, some control IC devices utilized in automotive, aerospace, and industrial applications utilize memory-mapped configuration registers to store data utilized to configure associated mechanisms. For example, an aileron-control circuit may include a processor that utilizes sensor input data to calculate data defining optimal positions for ailerons provided on an aircraft's wings, whereby the processor periodically repositions the ailerons by way of periodically writing updated optimal aileron position (configuration) data into one or more configuration registers that are operably linked to positioning motors respectively attached to the ailerons. That is, the aileron positioning motors fix the ailerons' positions in accordance with the configuration data stored in (and transmitted to the motors from) the configuration register(s) at any given moment, whereby the aileron positioning motors reposition the ailerons each time the processor writes updated (new/different) configuration data into the configuration register(s). In this situation, the reliable detection of random hardware faults that may occur in the signal path between the processor and the positioning motors (e.g., in the configuration register) could critically affect safe operation of the aircraft. Unfortunately, currently available conventional fault detection circuits cannot be utilized to detect random hardware faults occurring in configuration registers. That is, most conventional fault detection circuits mainly focus on counter/shifter circuits and adder circuits in a way that is inconsistent with configuration register operations. Some conventional fault detection circuits require a special low frequency clock and/or other special control circuitry that would require significant reconfiguration of the control circuitry utilized to control data input into the configuration register(s). Other conventional fault detection circuits are configured for use in register-files, which are a type of fixed-size memory, and utilize duplication approaches that are only for narrow-width values and require significant chip area to implement. Moreover, none of the existing fault detection circuits includes a self-text function that verifies proper operation of the fault detection circuit.

What is needed is a scalable fault detection circuit capable of reliably detecting random hardware faults occurring in configuration registers and can be easily integrated into existing IP/IC (circuit designs) and address the problems set forth above.

SUMMARY OF THE INVENTION

The present invention is directed to a fault detection circuit that is entirely controlled by existing register input control signal(s) during normal IC device operations and performs a parity validation process to reliably detect random hardware faults occurring in a configuration register. In a practical exemplary embodiment, an IC device includes function circuitry (e.g., a processor) utilized on a vehicle (e.g., an aircraft), wherein the functional circuitry is configured to generate periodically updated configuration data bytes (i.e., combination of multiple bit values) that are stored in the configuration register and utilized to control (configure) a critical circuit/device of the vehicle (e.g., a flight control surface of the aircraft). During each of these periodic configuration update operations, the register input control signal(s) is/are asserted to facilitate the transfer of an updated configuration data byte to the configuration register, whereby each configuration data bit value of the updated configuration data byte over-writes the previously stored data bit value in an associated memory location (e.g., a flip-flop) of the configuration register. At the end of each configuration update operation, the register input control signal(s) is/are de-asserted, whereby the configuration register maintains (stores) and transmits the updated configuration data byte to the critical circuit/device until a subsequent periodic configuration update operation is performed. In this context, the fault detection circuit of the present invention utilizes a parity bit-pair generator and a comparator to perform the parity validation processes capable of detecting random hardware faults by way of detecting erroneous changes in the configuration data byte stored in the configuration register. Specifically, the parity bit-pair generator is configured to provide sequentially generated parity bits having associated parity bit values that are determined by the even/odd parity of the configuration data byte currently stored in the configuration register, and the comparator is configured assert a mismatch signal when any pair of sequential parity bits received from the parity bit-pair generator includes mismatching (not equal) values, which indicates that the configuration register has incurred a random hardware fault. According to an aspect of the present invention, the fault detection circuit utilizes the existing register input control signal to disable the parity validation process during the periodic configuration update operations in order to prevent false fault detections when the even/odd parity of a "new" updated configuration byte differs from the even/odd parity of an "old" (previous) configuration byte stored in the configuration register (i.e., where the new updated configuration byte over-writes the old configuration data byte). In a presently preferred embodiment, the fault detection circuit enables/disables the parity validation process using a detection enable circuit and an output driver, where the detection enable circuit is configured to assert an output driver control signal only when said register input control signal is de-asserted (i.e., during clock cycles occurring between sequential configuration update operations), and the output driver is configured to assert a fault detection signal only when both the mismatch signal and the output driver control signal are asserted. With this configuration, the fault detection circuit of the present invention is able to detect a random hardware fault occurring in the memory-mapped configuration register using minimal circuitry having a very small circuit footprint, and without requiring changes to existing configuration register control circuitry by way of using the existing register input control signal to entirely control the parity validation process during normal IC device operations. Accordingly, the fault detection circuit of the present invention can be easily incorporated (and possibly automatically inserted by an EDA tool) into existing IP/IC (circuit designs) that are utilized in a wide range of mission-critical or life-critical applications, thereby making these applications substantially safer at a minimal cost.

According to a first specific embodiment, the parity bit-pair generator includes a parity calculator circuit and a parity register that are operably configured to simultaneously transmit a current (second) parity bit and a previous (first) parity bit to the comparator. Specifically, the parity calculator circuit is coupled to the register output signal lines and is implemented using combinatorial logic in accordance with known techniques to generate a parity bit value corresponding to the parity defined by the configuration data byte stored in the configuration register. The parity calculator may be modified using known techniques to generate parity bits for configuration data bytes of any size (i.e., any number of configuration data bit values), thereby making the fault detection circuit of the present invention scalable for use with any configuration register. The parity register is operably configured to receive and store each parity bit generated by the parity calculator circuit such that, during a given current (second) clock cycle, a current (second) parity bit is transmitted on an output terminal of the parity calculator circuit while the corresponding previous (first) parity bit is transmitted on an output terminal of the parity register. This parity bit-pair generator configuration facilitates implementing the comparator using a simple (e.g., exclusive-OR) logic gate, which further facilitates forming the fault detection circuit of the present invention with a small footprint. According to another specific embodiment, the detection enable circuit and the output driver circuit are implemented using respective (second and third) logic gates to further minimize the size of the fault detection circuit.

In a presently preferred embodiment, the fault detection circuit is further configured to immediately detect configuration data writing errors by way of a parity multiplexer that facilitates a parity update mode in which new/updated configuration data bytes are passed to the parity calculator before being stored in the configuration register. The parity multiplexer includes input terminals respectively connected to the register output signal lines and register input signal lines, an output terminal connected to the parity calculator. The parity multiplexer is controlled by assertion and de-assertion of a data source selection control signal to shift the fault detection circuit between the parity update mode and the parity validation mode. During the parity update mode, the data source selection control signal is de-asserted in response to assertion of the register input control signal, thereby controlling the parity multiplexer to pass new (updated) configuration data from the register input signal lines to the parity calculator before the new configuration data is written into the configuration register, which in turn causes the parity calculator to generate a current parity bit value based on the even/odd parity defined by the new configuration data. Note that the output driver is disabled during the parity update mode due to the assertion of the register input control signal in the manner described above. During the parity validation mode, the data source selection control signal is asserted in response to de-assertion of the register input control signal, thereby controlling the parity multiplexer to pass the configuration data transmitted by the configuration register onto the register output signal lines to the parity calculator, which in turn causes the parity calculator to generate a current parity bit value based on the even/odd parity defined by the configuration data stored in the configuration register. By utilizing the parity multiplexer to route new configuration bytes to the parity calculator during each parity update mode, the fault detection circuit is able to compare the configuration data intended for storage in the configuration register with the actual configuration data stored in the configuration register, thereby facilitating the detection of random hardware faults that prevent the configuration register from accurately receiving and storing new configuration data.

According to another aspect of the preferred embodiment, the data source selection control signal is generated by the detection enable circuit, which also generates the output driver control signal as described above, thereby minimizing the overall size of the fault detection circuit. Note that, similar to the output driver control, control of the parity multiplexer is established entirely using the existing register input control signal (i.e., the data source selection control signal is asserted when said register input control signal is de-asserted, and the data source selection control signal is de-asserted when register input control signal is asserted). Accordingly, operation of the fault detection circuit in either the parity update mode or the parity validation mode is entirely controlled using existing control configuration register control signals, thereby facilitating integration of the fault detection circuit into existing IP/IC (circuit designs) with minimal modification to the existing IP/IC.

According to another presently preferred embodiment, the fault detection circuits of the present invention are utilized in conjunction with configuration register control circuitry that is configured to generate the register input control signal as a logic-0 signal value during parity validation mode operating periods, and to generate the register input control signal using one or more logic-1 signal values during parity update mode operations. When new configuration data is generated from several possible sources, this register input control signal assertion/de-assertion signal value scheme is achieved using multiple serially connected multiplexers, with the output terminals of each upstream multiplexers being connected to an associated first input terminal of an associated next-sequential downstream multiplexer, with the other input terminal of each multiplexer coupled to receive new (updated/program) configuration data from an associated configuration data source, and with the first input terminal of the most-upstream multiplexer connected to the register output signal lines. In this case, each serially connected multiplexers is controlled using an associated register input control signal to couple the register input signal lines to receive new configuration data) from a selected source when one register input control signal is asserted, and to couple the register input signal lines to the register output lines when all of the register input control signals are de-asserted. Utilizing this register input control signal assertion/de-assertion signal value scheme facilitates implementing the detection enable circuit using a simple logic gate (e.g., a multi-input NOR gate) whose output may be used to effectively disable both the output drive and to control the parity multiplexer during each periodic configuration update operation (i.e., when in the parity update mode), thereby facilitating both the new/updated configuration data routing and preventing the generation of false error signals using a single logic gate and the existing register input control signals.

According to yet another embodiment, the host IC is further modified to facilitate an optional self-test procedure that functions to detect possible random hardware faults occurring in the fault detection circuit, thereby providing a higher level of protection against random-fault-based malfunctions than that provided by the fault detection circuit alone. In an exemplary embodiment, the register control circuitry is modified to include a self-test control circuit that asserts a self-test control signal during each self-test procedure, and the detection enable circuit is modified to include a logic gate that functions to override the error enable control signal during parity update mode operations that are performed while in the self-test procedure mode. Self-test data bytes are then written into the configuration register and passed to the parity bit-pair generator in sequences that would cause assertion of the mismatch and/or error signals if performed during normal operations. For example, one self-test data byte sequence may cause the comparator to assert the mismatch signal during a parity update mode but would prevent assertion of the error signal during normal operation; by utilizing the self-test control signal to override the error enable control signal, assertion of the mismatch signal can be verified using the self-test circuitry by way of detecting the assertion of the error signal. Various other self-test data sequences may be utilized to verify the correct operation of other portions of the fault detection circuit. Accordingly, the self-test configuration facilitates the detection of random hardware faults occurring in the fault detection circuit by way of transmitting self-test data patterns and comparing the actual signal levels of the error signal with the expected signal levels to verify proper operation of the fault detection circuit. The self-test procedure is implemented, for example, as part of a power-up routine.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to fault detection circuits for IC devices that include mapped registers, where the phrase "mapped register" is defined herein to include configuration registers, data registers and some status registers (i.e., status registers that allow both read and write access) that are either memory mapped or port mapped. The invention is described herein with reference to various exemplary embodiments that include memory mapped configuration registers, which represent a specific type of mapped register that store configuration data. The appended claims are intended to apply to IC devices that include at least one mapped register that stores associated data (e.g., status data stored on a status register) and at least one of the novel fault detection circuits described herein; that is, the claims are not intended to be limited by the memory mapped configuration registers and configuration data described in the exemplary embodiments unless otherwise specified in the associated claim(s).

The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
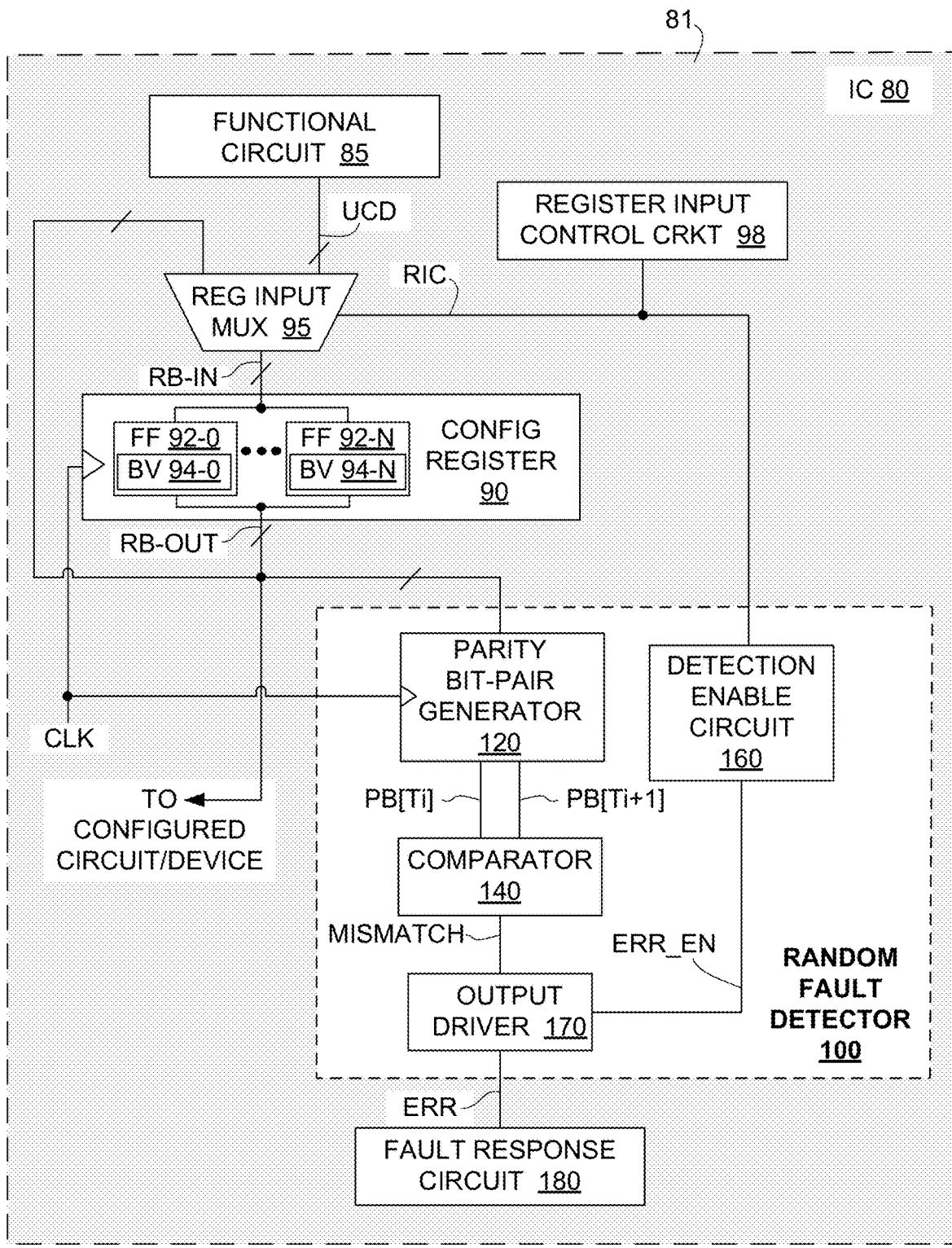
FIG. 1 is a block diagram showing an integrated circuit device including a fault detection circuit according to a generalized embodiment of the present invention.

FIG. 1 shows a greatly simplified integrated circuit (IC) device 80 including an associated fault detection circuit 100 that is configured in accordance with a generalized embodiment of the present invention to detect random hardware faults occurring in or adjacent to an associated configuration register 90, which is controlled during operation of IC device 80 as described below by control circuitry made up of an input multiplexer (REG INPUT MUX) 95 and a register input control circuit 98. IC device 80 also includes a functional circuit 85 (e.g., a processor and input/output circuitry, not shown)) that are operably configured to generate periodically updated configuration data UCD, and fault response circuitry 87 that utilizes error signals ERR generated by fault detection circuit 100 to take appropriate corrective or mitigating actions. Details regarding the configuration and operation of functional circuitry 85 and fault response circuitry 87 are well known in the art, and are therefore omitted for brevity. All of the above circuits of IC device 80 are integrally fabricated on a semiconductor (e.g., silicon) substrate (chip) 81 using any know photolithographic fabrication process (e.g., CMOS).

Configuration register 90 is configured using known techniques to store multiple configuration data bit values that are respectively received on register input signal lines RB-IN, and configured to transmit the stored configuration data bit values on corresponding register output signal lines RB-OUT. In one embodiment, configuration register is a conventional memory-mapped register including conventional flip-flops 92-0 to 92-N disposed in a selected data configuration (e.g., parallel-in to parallel-out) such that each flip-flop is operably coupled to receive a configuration data bit transmitted on an associated register input signal lines RB-IN, and flip-flops 92-0 to 92-N are controlled by a system clock signal CLK to store and transmit corresponding configuration data bit values 94-0 to 94-N onto corresponding associated register output lines RB-OUT according to known techniques. For example, an input terminal of flip-flop 92-0 is coupled to receive and store a configuration data bit value 94-0 from an associated signal line of register input signal lines RB-IN during a first cycle of system clock signal CLK, and an output terminal of flip-flop 92-0 is coupled to transmit configuration data bit value 94-0 onto an associated signal line of register output signal lines RB-OUT during the subsequent (second) clock cycle. For convenience, configuration data bit values 94-0 to 94-N that are stored in configuration register 90 at a given point in time are collectively referred to as a configuration data byte, although in this context "byte" is intended to mean two or more data bit values that may form a conventional byte (e.g., a six-bit, eight-bit or sixteen-bit byte), or may represent only a portion of a conventional byte. Also, configuration data bit values 94-0 to 94-N are not intended to represent all configuration data bits stored in configuration register 90; that is, configuration register may include additional flip-flops (i.e., in addition to flip-flops 92-0 to 92-N) that may be operably coupled to one or more additional fault detection circuit configured as described below with reference to fault detection circuit 100. Moreover, IC device 80 may include multiple configuration registers (not shown) similar to configuration register 90, and one or more of these additional may be coupled to associated additional fault detection circuit.

Register input multiplexer 95 is configured to transfer updated (new) configuration data to configuration register 90 during periodic configuration update operations in response to a register input control signal RIC. During each configuration update operation, register input multiplexer 95 is controlled in response to assertion of register input control signal RIC to transfer an updated configuration data byte UCD from a selected source (not shown) to the input terminals of configuration register 90 by way of register input signal lines RB-IN, whereby the updated configuration data byte UCD overwrites configuration data that was previously stored in flip-flops 92-0 to 92-N (i.e., configuration data bit values 94-0 to 94-N are changed to include corresponding bit values of updated configuration data byte UCD). During idle operating periods (i.e., time periods occurring between sequentially performed configuration update operations), register input multiplexer 95 is controlled in response to de-assertion of a register input control signal RIC to retain the last-received updated configuration data UCD in configuration data bit values 94-0 to 94-N (e.g., by way of preventing the transfer of updated configuration data byte UCD onto register input signal lines RB-IN, and by way of feeding-back currently stored configuration data bit values 94-0 to 94-N onto register input signal lines RB-IN).

Register input control circuit 98 is configured using know techniques to generate register input control signal RIC such that register input control signal RIC is asserted during each configuration update operation, and such that register input control signal RIC is de-asserted during the intervening idle operating periods. In a simple embodiment in which register input control signal RIC is binary, register input control circuit 98 asserts register input control signal RIC by way of generating a logic-1 (e.g., 1V) signal value on the associated signal line, and de-asserts register input control signal RIC by generating a logic-0 (e.g., 0V) signal value on the associated signal line. In other embodiments in which register input control signal RIC includes more than one bit value, register input control circuit 98 asserts register input control signal RIC by way of generating any of the bit values as a logic-1 signal values on respective associated signal lines, whereby register input control signal RIC is de-asserted only when all of the bit values are generated as logic-0 signal values on all of the respective associated signal lines. In the embodiments described herein, assertion of register input control signal RIC (i.e., where the digital/binary value of register input control signal RIC is greater than zero) corresponds with the execution of a configuration update operation during which updated configuration data UCD is written into configuration register 90 (e.g., by way of controlling register input multiplexer 95 to pass updated configuration data UCD onto register input signal lines RB-IN from an associated source), and de-assertion of register input control signal RIC (i.e., where the digital/binary value of register input control signal RIC is equal to zero) corresponds with an idle period during which previously stored configuration data is maintained in configuration register 90 (e.g., by way of controlling register input multiplexer 95 to feed-back the bit values on register output signal lines RB-OUT onto register input signal lines RB-IN). As described below, this RIC>0/RIC=0 assertion/de-assertion signal value scheme facilitates implementing detection enable control circuit 160 of fault detection circuit 100 using a single logic gate.

Fault detection circuit 100 utilizes a parity bit-pair generator 120 and a comparator 140 to identify random hardware faults that cause configuration register 90 to transmit erroneous configuration data to a configured circuit/device, and utilizes a detection enable circuit 160 and an output driver 170 to limit the generation of error (positive random fault detection) signals ERR to parity validation mode operations, which coincide with the idle periods between configuration updates operations during normal operation of IC device 80.

Parity bit-pair generator 120 is configured to generate parity bits for some or all of configuration bit values 94-0 to 94-N stored in register 90. In a preferred embodiment, parity bit-pair generator 120 utilizes a well-known parity calculator circuit that can be modified using known techniques to generate a parity bit for a submitted byte/word having any number of bits. Accordingly, by utilizing parity as the basic protection mechanism for identifying random hardware faults, fault detection circuit 100 is easily scalable to any number of configuration bit values. To minimize chip are required to implement the fault detection strategy of the present invention, parity bit-pair generator 120 is configured to generate a parity bit value for the entire register word/width (i.e., all configuration bit values 94-0 to 94-N stored in register 90). However, in an alternative embodiment, parity bit-pair generator 120 may be configured to generate a parity bit for only some of the configuration bit values stored in configuration register 90 (e.g., one byte of a multi-byte register), with one or more additional fault detection circuits being provided to detect random hardware faults for portions of configuration register 90 that store the remaining configuration bit values.

Parity bit-pair generator 120 is configured to sequentially generate parity bits, indicated by parity bits PB[Ti] and PB[Ti+1] respectively having associated parity bit values that are determined by the configuration data byte stored in configuration register 90 during sequential cycles Ti and Ti+1 of system clock signal CLK. That is, parity bit-pair generator 120 is configured to sample the configuration data bit values transmitted onto register output signal lines RB-OUT once during each clock cycle, and to generate a pair of parity bits that include a current (first) parity bit PB[Ti+1] generated during a current (first) clock cycle CLK=Ti+1, and a previous (second) parity bit pair PB[Ti] generated during a previous (second) clock cycle CLK=Ti (i.e., previous clock cycle CLK=Ti represents the clock cycle of system clock signal CLK that occurred immediately before current clock cycle CLK=Ti+1). Each parity bit PB[Ti] and PB[Ti+1] is generated with a parity bit value having a first logic level (e.g., logic-1) when the corresponding configuration bit values transmitted on register output signal lines RB-OUT define an even parity, and is generated with a parity bit value having a second logic level (e.g., logic-0) when the corresponding bit values transmitted on register output signal lines RB-OUT define an odd parity. For example, if configuration bit values "1111" are transmitted on register output signal lines RB-OUT during both clock cycles Ti and Ti+1, then both parity bits PB[Ti] and PB[Ti+1] are generated with corresponding parity bit values equal to logic-0 (i.e., due to the even parity of the configuration byte "1111"). In contrast, if a configuration byte "1011" is transmitted during both clock cycles Ti and Ti+1, then both parity bits PB[Ti] and PB[Ti+1] are generated with corresponding parity bit values equal to logic-1, indicating the corresponding odd-parity. Conversely, if the configuration byte changes from even-parity to odd parity (or from odd-parity to even-parity) between clock cycles Ti and Ti+1, then parity bits PB[Ti] and PB[Ti+1] will be generated with mismatching (different) parity bit values. In alternative embodiments, parity bit-pair generator 120 may be configured such that parity bits generated for odd-parity configuration bytes have a logic-0 bit value, and parity bits generated for even-parity configuration bytes have a logic-1 bit value. That is, the present invention itself is agnostic to the applied parity-scheme.

Comparator 140 is configured to compare each parity bit-pair PB[Ti] and PB[Ti+1], and to assert a mismatch signal MISMATCH (i.e., mismatch signal MISMATCH is generated as a logic-1) only when associated parity bits PB[Ti] and PB[Ti+1] have mismatching values. That is, when the parity bit value of parity bit PB[Ti] is different from the parity bit value of parity bit PB[Ti+1] (e.g., PB[Ti]=logic-1 and PB[Ti+1]=logic-0), then mismatch signal MISMATCH is asserted (logic-1). Conversely, when the parity bit value of parity bit PB[Ti] matches (is the same as) the parity bit value of parity bit PB[Ti+1], comparator 140 de-asserts the mismatch signal (i.e., MISMATCH=logic-0).

According to an aspect of the present invention, fault detection circuit 100 utilizes register input control signal RIC in conjunction with detection enable circuit 160 and output driver 170 to disable parity validation mode operations during each periodic configuration update operation in order to prevent incorrect (false) assertions of error signal ERR that can occur when the even/odd parity of a current updated configuration byte differs from the even/odd parity of a previous configuration byte. That is, although the operation of parity bit-pair generator 120 and comparator 140 described above is able to detect random hardware faults that cause the current configuration byte to change (e.g., one flip-flop malfunctions, causing the desired configuration byte to change from "1111" to "1101" between clock cycles Ti and Ti+1), this operation could generate false (erroneous) mismatch detections when an even/odd parity configuration byte is overwritten by an odd/even parity configuration byte during a given periodic configuration update operation. To address this issue, fault detection circuit 100 disables the parity validation mode during the idle periods between two sequential periodic configuration update operations by utilizing detection enable circuit 160 to assert an output driver control signal ERR-EN when register input control signal RIC is de-asserted (i.e., during clock cycles occurring in idle periods between periodic configuration update operations), and utilizing output driver 170 to assert fault detection signal ERR only when both mismatch signal MISMATCH and output driver control signal ERR-EN are asserted. With this configuration, the fault detection circuit 100 of the present invention is able to detect a random hardware fault occurring in the memory-mapped configuration register 90 while preventing false assertions of fault detection signal ERR that can occur during periodic configuration update operations.

Figure 2:
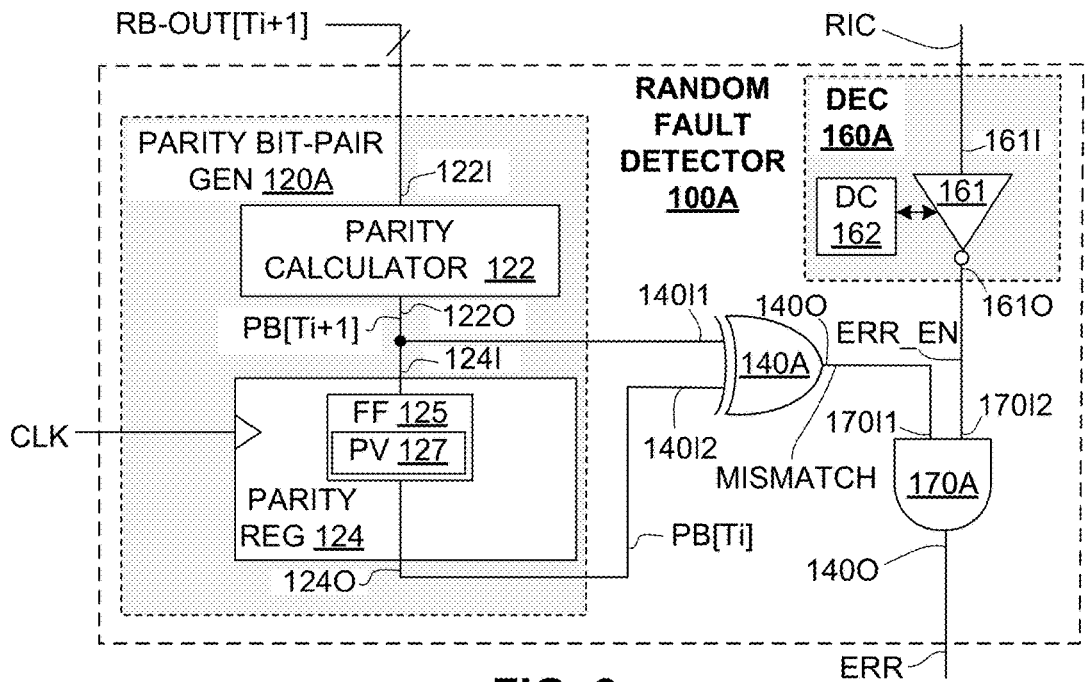
FIG. 2 is a simplified diagram depicting a fault detection circuit according to at specific embodiment of the present invention.

FIG. 2 depicts a fault detection circuit 100A that implements the circuitry described above with reference to FIG. 1 using exemplary logic gates and other standard circuits in accordance with a first exemplary embodiment. Those skilled in the art will recognize that the specific logic gates and standard circuits utilized by fault detection circuit 100A represent one possible configuration capable of performing the fault detection circuit operations corresponding to the present invention, and are therefore not intended to be limiting.

Referring to the left side of FIG. 2, parity bit-pair generator 120A is implanted using a parity calculator circuit 122 and a parity register 124 that are operably configured to simultaneously transmit a current (second) parity bit PB[Ti+1] and a previous (first) parity bit PB[Ti] to comparator 140A. In this case, parity calculator circuit 122 has input terminals 122I operably coupled to register output signal lines RB-OUT, and is configured using know techniques to generate one parity bit value on its output terminal 122O during each cycle of system clock CLK. That is, the parity bits generated by parity calculator 122 have parity bit values that correspond to the even/odd parity defined by the configuration data byte (i.e., configuration bit values BV 94-0 to 94-N) currently stored in the configuration register 90. Parity register 124 has an input terminal 124I connected to output terminal 122O of parity calculator circuit 122 and is configured (e.g., using flip-flop FF 125) to store a previous parity bit value PV 127 (i.e., a parity bit generated during the last cycle of system clock signal CLK), and to transmit the previous parity bit value on its output terminal 124O. With configuration, during a current clock cycle Ti+1, parity register 124 stores a previous parity bit PB[Ti], and transmits the logic level value of parity bit PB[Ti] on its output terminal 124O while parity calculator 122 generates a current parity bit value PB[Ti+1] on its output terminal 122O. This parity bit pair (i.e., parity bits PB[Ti] and PB[Ti+1] are respectively applied to input terminals 140I1 and 140I2 of comparator 140A, which in the current embodiment is implemented using a two-input exclusive-OR logic gate having an output terminal 140O that is connected to an input terminal 170I1 of output driver 170A. With this arrangement, exclusive-OR logic gate 140A de-asserts mismatch signal MISMATCH when parity bits PB[Ti] and PB[Ti+1] are generated with the same logic level (i.e., both logic "1" or both logic "0", and asserts mismatch signal MISMATCH as a high value when parity bit PB[Ti] differs from PB[Ti+1].

Referring to the right side of FIG. 2, note that register input control signal RIC is implemented as a binary signal in the present embodiment, whereby the detection enable circuit (DEC) 160A is implemented in part by a (second) inverter logic gate 161 and the output driver is implemented using a (third) AND logic gate 170A. Inverter logic gate 161 has an input terminal 161I operably coupled to receive register input control signal RIC from register control circuitry 98 (FIG. 1), and generates output driver control signal ERR-EN on its output terminal 161O as an inverted form of register input control signal RIC (i.e., such that driver control signal ERR-EN is logic-1 when register input control signal RIC is logic-0, and ERR-EN is logic-0 when register input control signal RIC is logic-1). In order to implement the embodiment shown in FIG. 2, detection enable circuit 160A must be further configured such that inverter 161 is caused to delay the re-assertion of error enable control signal ERR_EN to allow updated configuration bytes to be stored in configuration register 90 before re-assertion of error enable control signal ERR_EN. For example, detection enable circuit 160A may include a delay circuit (DC) 162 configured to control inverter 161 such that error enable control signal ERR_EN is de-asserted each time register input control signal RIC is asserted, and such that error enable control signal ERR_EN remains de-asserted for a period of two clock cycles after each assertion of register input control signal RIC 162. AND logic gate 170A has a first input terminal 170I1 connected to output terminal 140O of exclusive-OR logic gate 140A and a second input terminal 170I2 connected to output terminal 161O of inverter logic gate 161. When combined with the RIC>0/RIC=0 assertion/de-assertion signal value scheme described above, this configuration effectively disables output drive (AND logic gate) 170A during each periodic update operation, thereby preventing the generation of false error signals ERR when configuration register 90 (FIG. 1) is updated to replace an even-parity configuration byte with an odd-parity configuration byte, or vice versa.

FIGS. 3A to 3E show a portion of random fault detector 100A (FIG. 2) during an exemplary operating sequence, and illustrate how the combination of the RIC>0/RIC=0 assertion/de-assertion signal value scheme and the simple circuitry of fault detector 100A prevents the generation of false error signals. These figures depict random fault detector 100A at different times T1 to T5, with the suffixes T0 to T5 being utilized to indicate operating states and/or signal levels generated during a corresponding sequence of clock cycles (e.g., "100A[T1]" and "RB-OUT[T1]" in FIG. 3A respectively indicate the state of random fault detector 100A and the corresponding signal levels generated on register output signal lines RB-OUT at time/clock cycle T1). Note that the delayed re-assertion of error enable control signal ERR_EN, which is mentioned above, is omitted from the description of FIGS. 3A to 3E for brevity.

Figure 3A:
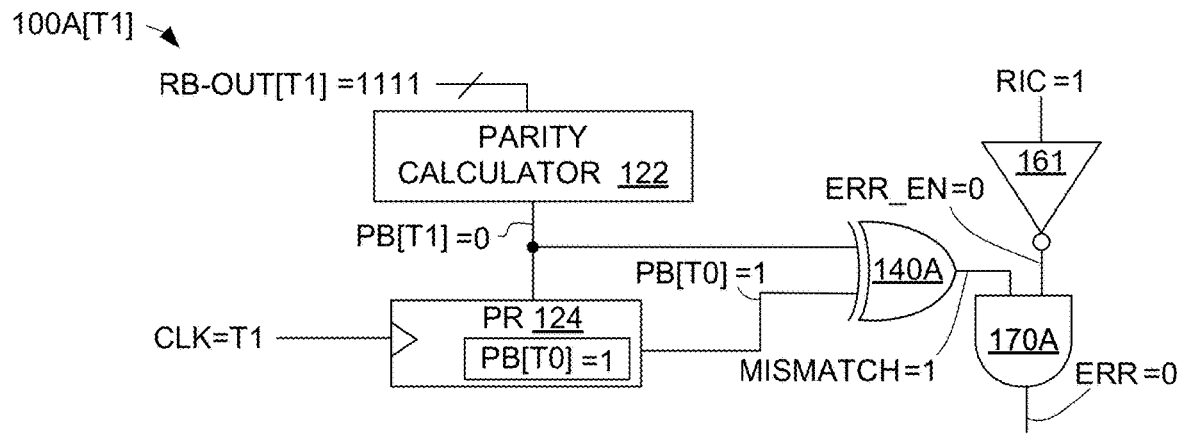
FIGS. 3A, 3B, 3C, 3D and 3E are simplified diagram depicting exemplary operations of the fault detection circuit of FIG. 2.

FIG. 3A depicts random fault detector 100A during a time/clock cycle T1. Note that parity register (PR) 124 stores a previously received parity bit PB[T0] having a logic-1 bit value, that register output signal lines RB-OUT carry a four-bit byte value "1111", and that register input control signal RIC is asserted, indicating that a configuration update operation is being performed at time T1. In response to the even-parity defined by the byte on RB-OUT[T1], parity calculator 122 generates a current parity bit PB[T1] having a logic-0 value. Because the two values PB[T0] and PB[T1] applied to comparator (exclusive-OR logic gate) 140A are different, mismatch signal MISMATCH is asserted (logic-1). However, because register input control signal RIC is asserted (logic-1), which causes detection enable circuit (inverter logic gate) 161 to generate output enable signal ERR_EN as a logic-0 signal value. Accordingly, even though mismatch signal MISMATCH is asserted, output driver 170A is effectively disabled by output enable signal ERR_EN, thereby preventing the generation of a false error signal (i.e., error signal ERR is generated as a logic-0 signal value).

Figure 3B:
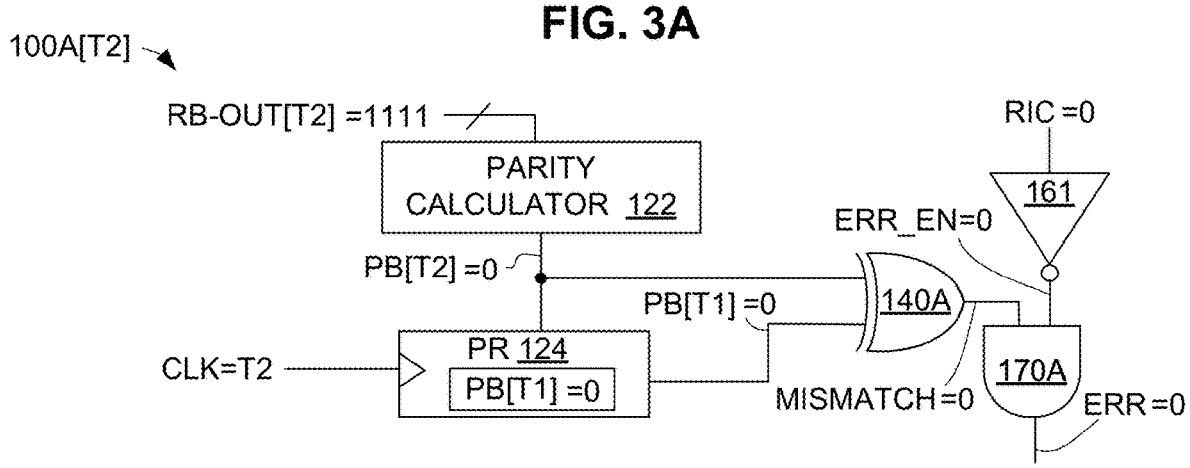

FIG. 3B depicts random fault detector 100A during a subsequent time/clock cycle T2. Parity register 124 is configured such that (first) parity bit PB[T0] is overwritten (replaced) by (second) parity bit PB[T1] during clock cycle T2, which occurs immediately after clock cycle T1, whereby parity register 124 stores parity bit PB[T1] having the logic-0 bit value at time T2. In accordance with the example, register output signal lines RB-OUT carry a four-bit byte value "1111", which represents a configuration byte stored in configuration register 90 (FIG. 1) at time T2, and register input control signal RIC is de-asserted, indicating that a configuration update operation is not being performed at time T2. The even-parity of the configuration byte transmitted on RB-OUT[T2] causes parity calculator 122 to again generate a current parity bit PB[T2] having a logic-0 value. Because the two values PB[T1] and PB[T2] applied to the input terminals of comparator 140A are equal, mismatch signal MISMATCH is de-asserted (logic-0). Because register input control signal RIC is de-asserted (logic-0), detection enable circuit (inverter logic gate) 161 asserts output enable signal ERR_EN. Accordingly, even though output enable signal ERR_EN has a logic-1 signal value output driver 170A generates error signal ERR as a logic-0 signal value due to the de-assertion of mismatch signal MISMATCH.

Figure 3C:
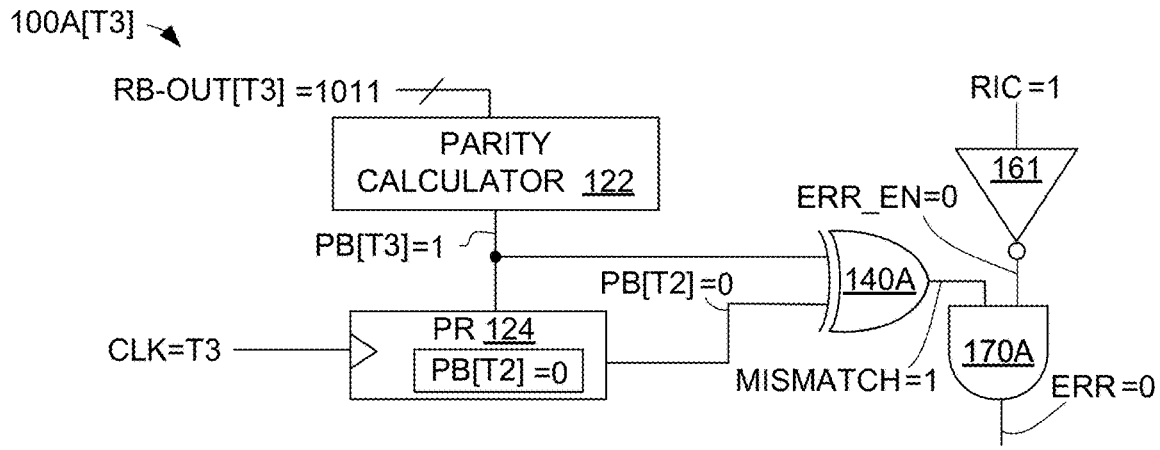

FIG. 3C depicts random fault detector 100A during a subsequent time/clock cycle T3 when parity register 124 stores parity bit PB[T2], register output signal lines RB-OUT carry a four-bit byte value "1011", and register input control signal RIC is asserted, indicating that a configuration update operation is being performed at time T3. The odd-parity of the byte transmitted on register output signal lines RB-OUT[T3] causes parity calculator 122 to generate a current parity bit PB[T3] having a logic-1 value. Because the two values PB[T3] and PB[T2] applied to the input terminals of comparator 140A are different at time T3, mismatch signal MISMATCH is asserted (logic-1). Because register input control signal RIC is asserted (logic-1), detection enable circuit (inverter logic gate) 161 de-asserts output enable signal ERR_EN, thereby disabling output driver 170A and again preventing the generation of a false error signal.

Figure 3D:
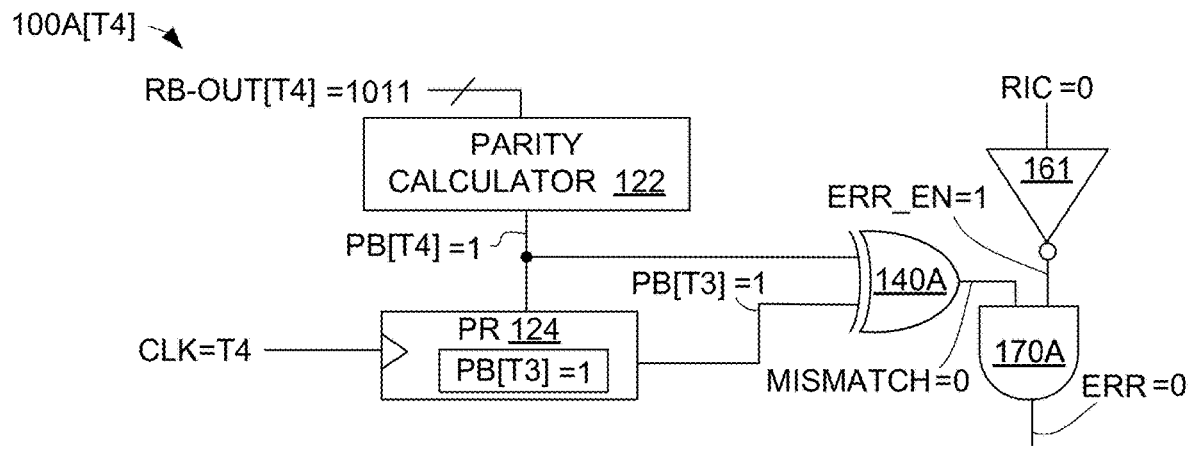

FIG. 3D depicts random fault detector 100A during a subsequent time/clock cycle T4 when parity register 124 stores parity bit PB[T3], register output signal lines RB-OUT carry the four-bit byte value "1011", and register input control signal RIC is de-asserted, indicating that a configuration update operation is not being performed at time T4. The odd-parity of the byte transmitted on register output signal lines RB-OUT[T4] causes parity calculator 122 to generate a current parity bit PB[T4] having a logic-1 value. Because the two values PB[T3] and PB[T4] are equal at time T4, comparator 140A de-asserts mismatch signal MISMATCH (logic-0). Accordingly, although the de-assertion of register input control signal RIC causes detection enable circuit 161 to assert output enable signal ERR_EN, output driver 170A generates error signal ERR as a logic-0 value due to the logic-0 signal value of mismatch signal MISMATCH.

Figure 3E:
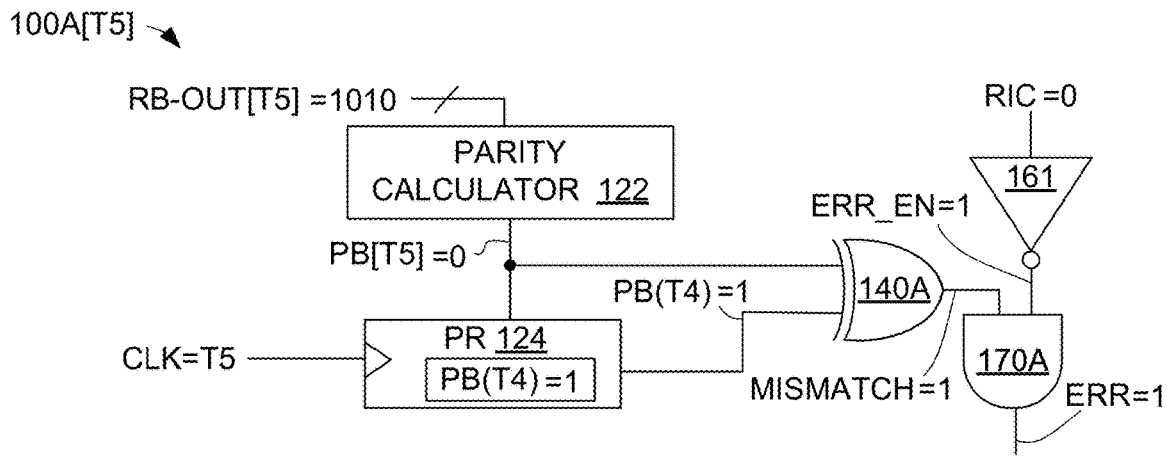

FIG. 3E depicts random fault detector 100A during a subsequent time/clock cycle T5 when parity register 124 stores parity bit PB[T4], register output signal lines RB-OUT carry the four-bit byte value "1010", and register input control signal RIC is de-asserted, indicating that a configuration update operation is not being performed at time T5. The even-parity of the byte transmitted on register output signal lines RB-OUT[T5] causes parity calculator 122 to generate a current parity bit PB[T5] having a logic-0 value. Because the two values PB[T5] and PB[T4] are different at time T5, comparator 140A asserts mismatch signal MISMATCH (logic-1). In addition, the de-assertion of register input control signal RIC causes detection enable circuit 161 to assert output enable signal ERR_EN. Accordingly, because a mismatch is detected while a configuration update operation is not being performed, output driver 170A generates error signal ERR as a logic-1 value, which effectively alerts the failure response circuit that a random hardware fault has occurred in the configuration register that produced configuration byte RB-OUT[T5].

Figure 4:
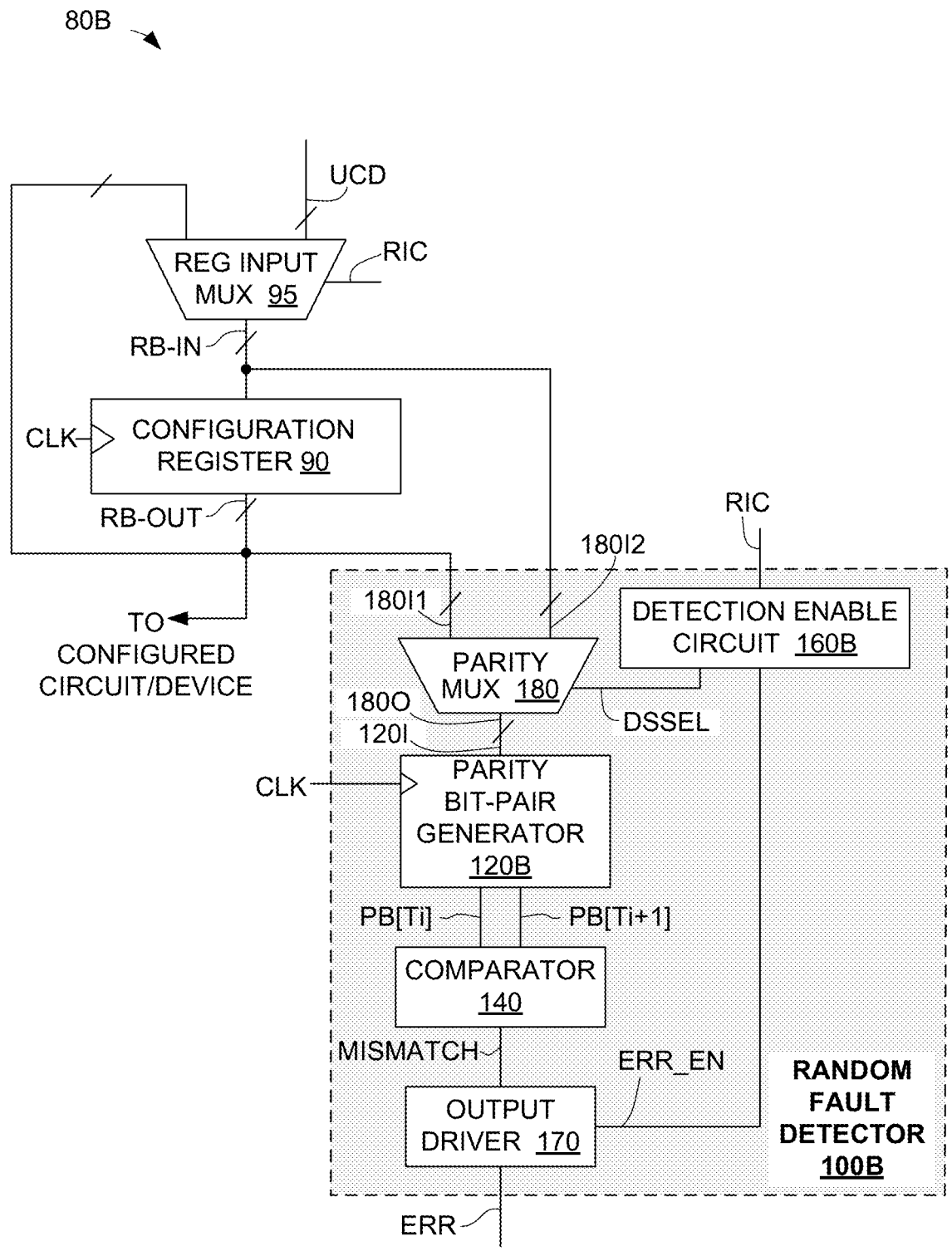
FIG. 4 is a simplified diagram depicting an integrated circuit device including a fault detection circuit according to another specific embodiment of the present invention.

FIG. 4 shows an IC device 80B including a fault detection circuit 100B that utilizes a parity multiplexer 180 to facilitate immediate detection of configuration data writing errors by way of routing a new/updated configuration data byte to parity bit-pair generator 122 before the new/updated configuration byte is stored in configuration register 90. Consistent with the embodiments set forth above, configuration register 90 receives either new/updated configuration data UCD from register input multiplexer 95 on register input signal lines RB-IN, and transmits stored configuration data onto register input signal lines RB-OUT, and random fault detector circuit 100B includes parity bit-pair generator 122 coupled to register input signal lines RB-OUT, comparator 140 and output drive 170, which are configured and operate essentially as described above. For brevity, details regarding the construction and operation of these circuit structures are incorporated from above and omitted below.

Fault detection circuit 100B differs from previous embodiments in that it includes parity multiplexer 180 having input terminals 180I1 and 180I2 respectively operably connected to register output signal lines RB-OUT and register input signal lines RB-IN, and having an output terminal 180O connected to the parity bit-pair generator 120B (i.e., such that a parity calculator of parity bit-pair generator 120 is coupled to register output signal lines RB-OUT by way of one set of signal paths through parity multiplexer 180, and is also coupled to register input signal lines RB-IN by way of a second set of signal paths through parity multiplexer 180). In this embodiment, detection enable circuit 160B is configured to de-assert a data source selection control signal DSSEL when register input control signal RIC is asserted by the register input control circuitry (not shown), and to assert data source selection control signal DSSEL when register input control signals RIC is de-asserted. Parity multiplexer 180 is controlled by the assertion and de-assertion of a data source selection control signal DSSEL to switch fault detection circuit 100B between a parity update mode and a parity validation mode, where updated configuration data UCD is passed from register input signal lines RB-IN to parity bit-pair generator 120B during the parity update mode (i.e., when data source selection control signal DSSEL is de-asserted), and stored configuration data bit values are passed from register output signal lines RB-out to parity bit-pair generator 120B in the parity validation mode (i.e., when data source selection control signal DSSEL is asserted).

Figure 5A:
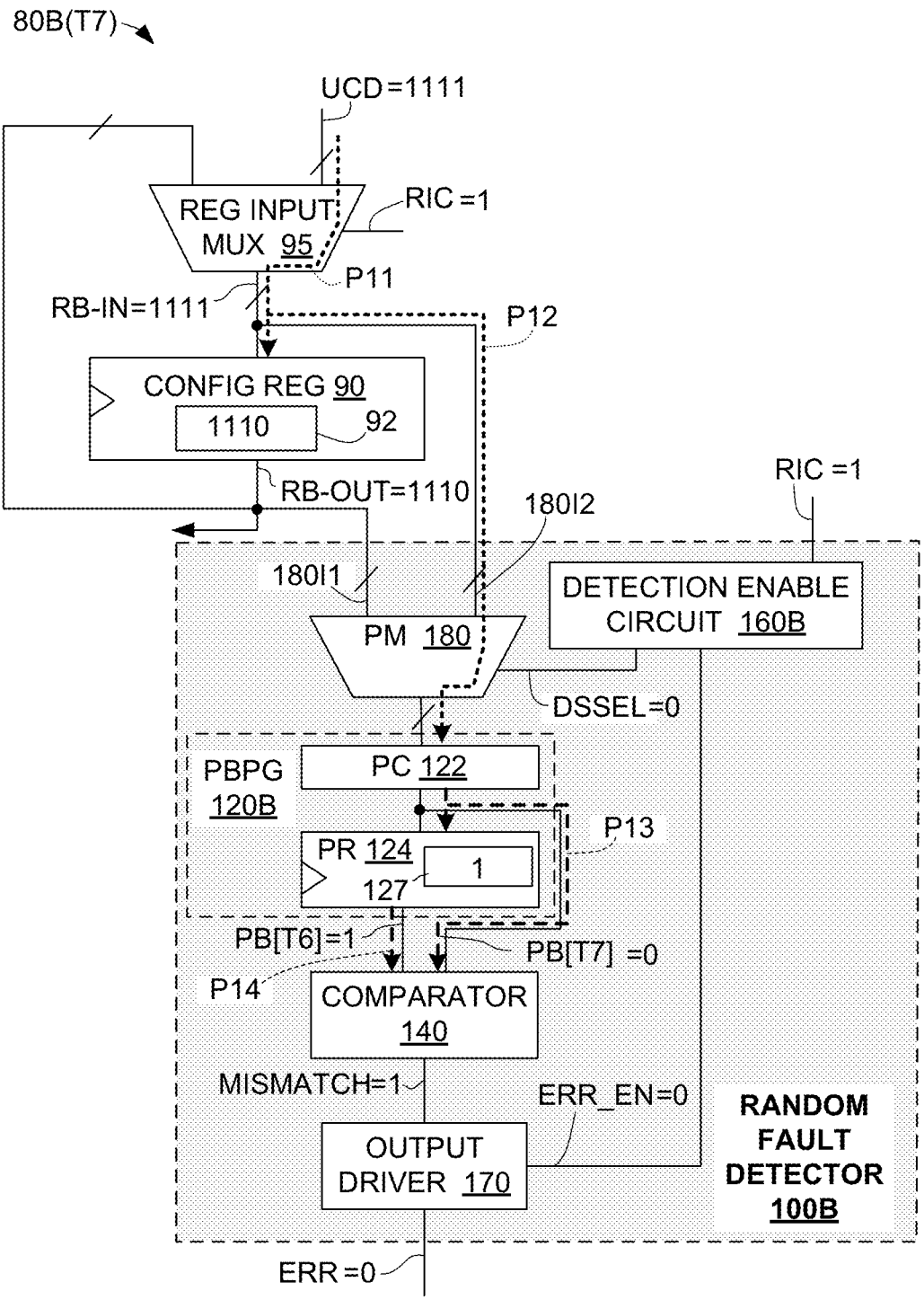
FIGS. 5A and 5B are simplified diagram depicting exemplary operations of the integrated circuit of FIG. 4.
Figure 5B:
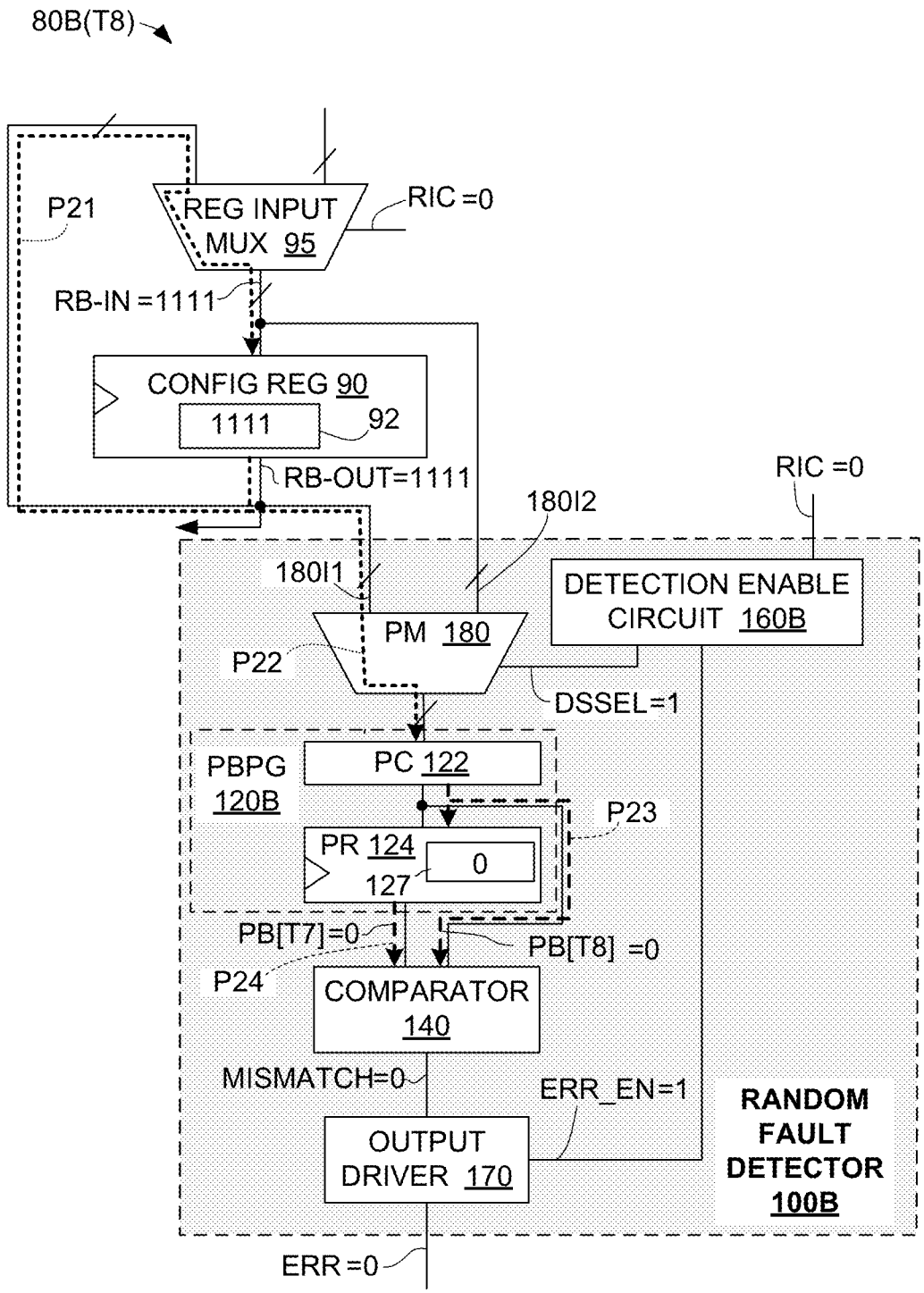

FIGS. 5A and 5B depict IC circuit 80B during exemplary parity update mode and parity validation mode operations. This example is simplified for descriptive purposes by way of using arbitrary four-bit configuration data values that are stored/written in IC circuit 80B during two sequential clock cycles, which are arbitrarily designated using time periods T7 and T8. Signal paths generated in IC circuit 80B during the exemplary parity update mode and parity validation mode operations are indicated by associated dotted-line or dashed-line arrows.

FIG. 5A depicts IC circuit 80B during exemplary parity update mode operation at time T7 during which a new/updated configuration data byte UCD "1111" is submitted for storage on configuration register 90. As discussed above, register input control signal RIC is asserted (i.e., RIC=1) during configuration update operations, whereby register input multiplexer 95 is controlled to pass updated configuration data byte UCD onto register input signal lines RB-IN, as indicated by signal path P11. Note that at this point configuration register 90 is not configured to read-in updated configuration data byte UCD, whereby register memory 92 retains previous configuration data byte value, which in this example is arbitrarily set at "1110". The assertion of register input control signal RIC causes detection enable circuit 160B to de-assert data source selection control signal DSSEL (i.e., DSSEL=0), thereby causing parity multiplexer (PM) 180 to pass updated configuration data byte UCD from register input signal lines RB-IN to parity calculator 122 of parity bit-pair generator (PBPG) 120B, as indicated by signal path P12, whereby parity calculator 122 generates updated parity bit value PB[T7] having a logic-0 bit value (i.e., due to the even-parity of updated configuration data byte UCD), whereby updated parity bit value PB[T7] is applied to the input terminal of parity register (PR) 124 and to comparator 140, as indicated by signal path P13. Note that at this point parity register 124 is not configured to read-in the updated parity bit value PB[T7], and parity register memory 127 retains previous parity bit value PB[T6] having a logic-1 bit value (i.e., due to the odd-parity of the previous configuration data byte stored in register memory 92 before time T7), where previous parity bit value PB[T6] is applied to the second input terminal of comparator 140, as indicated by signal path P14. Because current/updated parity bit value PB[T7] differs from previous parity bit value PB[T6], comparator 140 asserts the mismatch signal (i.e., MISMATCH=1). However, the assertion of register input control signal RIC causes detection enable circuit 160B to also de-assert the output enable signal (i.e., ERR_EN=0), thereby disabling output driver 170, whereby the error signal remains de-asserted (i.e., ERR=0). Accordingly, fault detection circuit 100B is prevented from indicating the detection of a random hardware fault when operating in the parity update mode.

FIG. 5B depicts IC circuit 80B at time T8, during exemplary parity validation mode operation performed at time T8 (i.e., immediately after time T7). At this point, the updated configuration data byte value "1111" that was transmitted during time T7 has been written into (i.e., captured and stored in) register memory 92, and is transmitted onto register output signal lines RB-OUT at time T8. In addition, the updated parity bit value "0" (which was generated by parity calculator 122 during time T7) has been written into (i.e., captured and stored in) parity register memory 127, and is transmitted to one input of comparator 140, as indicated by signal path P24. As discussed above, register input control signal RIC is de-asserted (i.e., RIC=0) in the absence of a configuration data update operation, whereby register input multiplexer 95 is controlled to generate a signal path P21 between register output signal lines RB-OUT. The de-assertion of control signal RIC also causes detection enable circuit 160B to assert the data source selection control signal (i.e., DSSEL=1), thereby causing parity multiplexer (PM) 180 to pass stored configuration data byte "1111" from register output signal lines RB-OUT to parity calculator 122, as indicated by signal path P22, whereby parity calculator 122 generates parity bit value PB[T8] having a logic-0 bit value (i.e., due to the even-parity of configuration data byte "1111"), whereby updated parity bit value PB[T8] is applied to the other input terminal of comparator 140, as indicated by signal path P23. Because parity bit value PB[T8] matches parity bit value PB[T7], comparator 140 de-asserts the mismatch signal (i.e., MISMATCH=0), whereby output driver 170 de-asserts the error signal (i.e., ERR=0) even though the output enable signal is asserted (i.e., ERR_EN=1) due to the de-assertion of register input control signal RIC. During the subsequent idle period following time T8 (i.e., until a subsequent configuration update operation), fault detector circuit 100B performs the parity validation mode operation depicted in FIG. 5B during each clock cycle, and error signal ERR remains de-asserted so long as mismatch signal MISMATCH remains de-asserted (i.e., parity register memory 127 would continue to store a logic-0 bit value, and parity calculator would continue to generate a logic-0 bit value so long as register memory retains configuration data byte "1111"). However, if a random hardware fault develops in configuration register 90 that causes a bit value stored in register memory 92 to switch from its current logic-0 value to a logic-1 value, this change in the stored configuration data during parity validation mode operations would cause parity calculator 122 to generate a logic-1 parity bit value, which would cause comparator 140 to assert mismatch signal MISMATCH, which in turn would cause output driver to assert error signal ERR, whereby random fault detector 100B would detect the random hardware fault.

Figure 6:
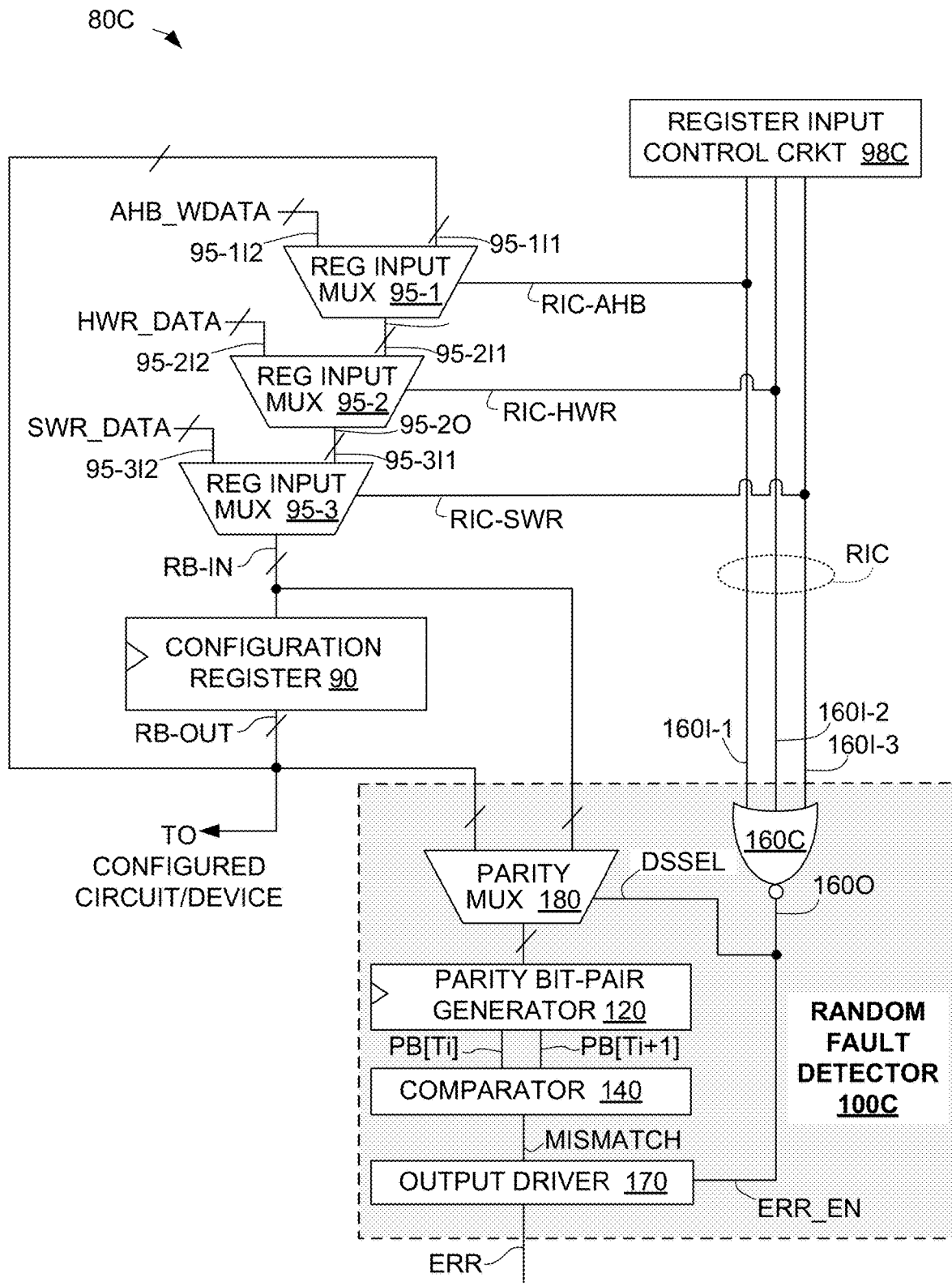
FIG. 6 is a simplified diagram depicting an integrated circuit device including a fault detection circuit according to another specific embodiment of the present invention.

FIG. 6 shows an IC device 80C according to another embodiment in which register input control signals RIC are utilized to control the flow of updated configuration data from multiple sources to configuration register 90. Consistent with the embodiments set forth above, configuration register 90 receives configuration data bytes transmitted on register input signal lines RB-IN from register input multiplexer 95-3, and transmits stored configuration data onto register input signal lines RB-OUT. Random fault detector circuit 100C includes parity multiplexer 180, parity bit-pair generator 120, comparator 140, and output drive 170 that are configured and operate during parity update mode and parity validation mode operations essentially as described above. For brevity, details regarding the construction and operation of these circuit structures are incorporated from above and omitted below.

IC device 80C differs from the previous embodiments in that three register input multiplexers 95-1, 95-2 and 95-3 are configured and implemented to respectively pass updated configuration data AHB_WDATA, HWR_DATA and SWR_DATA to register input signal lines RB-IN during update operations, and to pass stored configuration data fed-back from register output signal lines RB-OUT during idle periods between update operations. Specifically, register input multiplexers 95-1, 95-2 and 95-3 are configured such that the output terminals 95-1O and 95-2O of upstream multiplexers 95-1 and 95-2 are respectively connected to first input terminals 95-2I1 and 95-3I1 of downstream multiplexers 95-2 and 95-3, and the output terminal 95-3O of multiplexer 95-3 connected to register input signal lines RB-IN. In addition, the other (second) input terminal 95-1I2, 95-2I2 and 95-3I2 of multiplexers 95-1, 95-2 and 95-3 are respectively coupled to receive new (updated or program) configuration data bytes SWR_DATA, HWR_DATA, AHB_WDATA from associated configuration data sources, and the first input terminal 95-1I1 of most-upstream multiplexer 95-1 connected to register output signal lines RB-OUT. In addition, register input control circuitry 98C is configured to generate three register input control signals RIC-AHB, RIC-HWR and RIC-SWR (collectively referred to as register input control signals RIC), which are respectively applied to the control terminals of multiplexers 95-1, 95-2 and 95-3. Note that the generation of register input control signals RIC-AHB, RIC-HWR and RIC-SWR is in accordance with existing configuration register operation practices (i.e., register input control signals RIC-AHB, RIC-HWR and RIC-SWR are existing control signals in that they would be generated/utilized whether or not IC device 80C includes fault detection circuit 100C). According to a register input control signal assertion/de-assertion signal value scheme, register control circuitry 98C de-asserts all of register input control signals RIC-AHB, RIC-HWR and RIC-SWR (i.e., generates each as a logic-0 signal value) during parity validation mode operating periods, and asserts a selected one of register input control signals RIC-AHB, RIC-HWR and RIC-SWR (i.e., generate as a logic-1 signal value) during parity update mode operations. For example, to write a new configuration data SWR_DATA to configuration register 90 from an associated source (not shown), register input control signal RIC-SWR is asserted while register input control signals RIC-HWR and RIC-AHB remain de-asserted, thereby coupling input terminal 95-3I2 of multiplexer to register input signal lines RB-IN. In contrast, register input signal lines RB-IN is coupled to register output lines RB-OUT when all of register input control signals RIC-SWR, RIC-HWR and RIC-AHB are de-asserted. Utilizing this register input control signal assertion/de-assertion signal value scheme facilitates implementing detection enable circuit 160C using a simple logic gate (e.g., the three-input NOR gate depicted in FIG. 6) whose input terminals 160I-1, 160I-2 and 160I-3 are respectively connected to the control terminals of multiplexers 95-1, 95-2 and 95-3, and whose output terminal 160O provides both error enable control signal ERR_EN, which is used to disable/enable output drive 170, and a data source selection control signal DSSEL, which is used to control parity multiplexer 180 during each periodic update (parity update mode) operation. Therefore, a desired new/updated configuration data write operation is enabled and the generation of false error signals ERR are prevented using a single logic gate (i.e., logic-NOR gate 160C) and the existing register input control signals RIC-SWR, RIC-HWR, and RIC-AHB.

Figure 7:
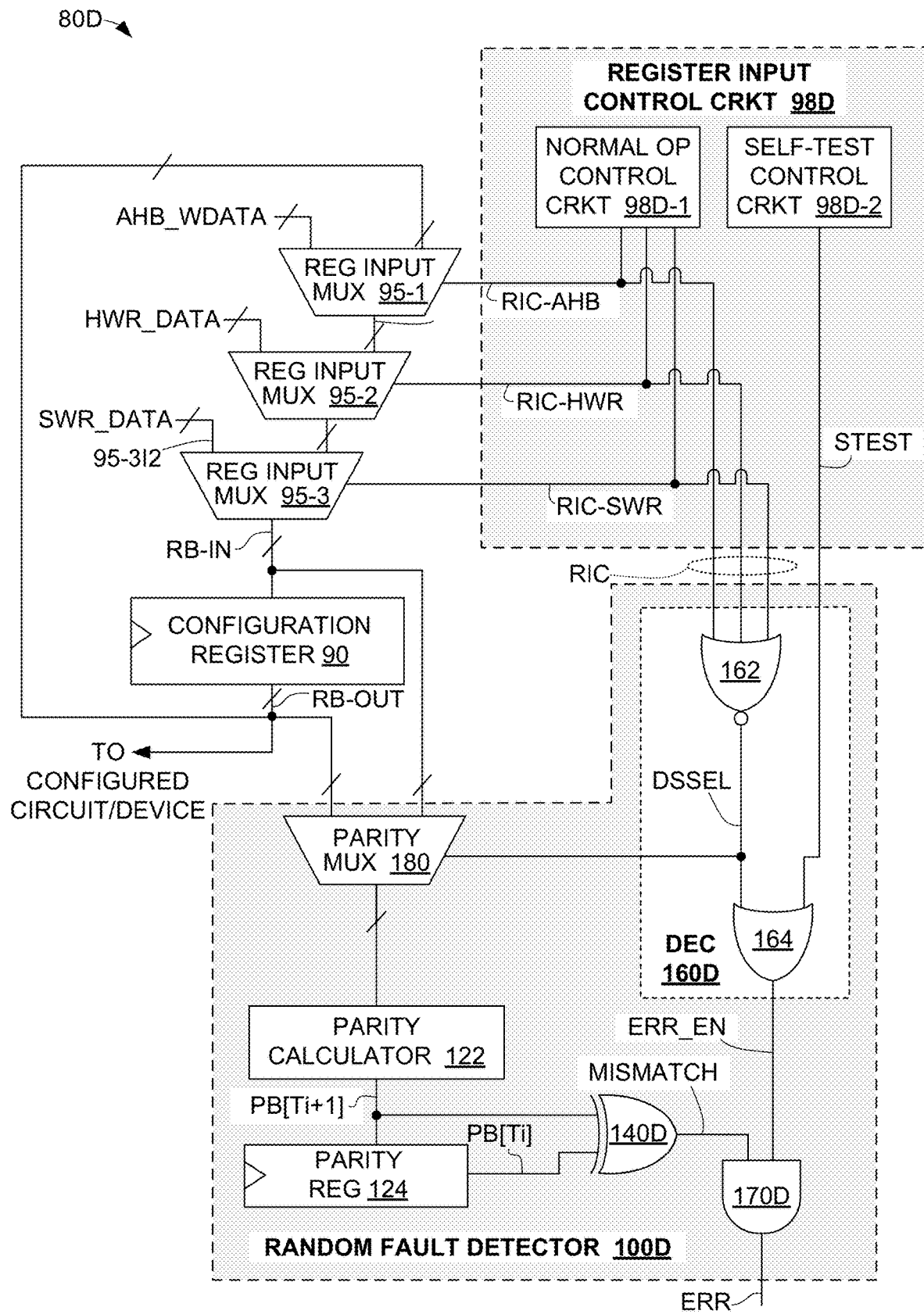
FIG. 7 is a simplified diagram depicting an integrated circuit device including a fault detection circuit according to yet another specific embodiment of the present invention.

FIG. 7 shows an IC device 80D according to another embodiment in which a self-test procedure is implemented to detect random hardware faults that may arise in fault detection circuit 100D. Consistent with the embodiments set forth above, IC device 80D includes configuration register 90 that receives configuration data bytes transmitted on register input signal lines RB-IN from register input multiplexer 95-3, and transmits stored configuration data onto register input signal lines RB-OUT. Register input multiplexers 95-1 to 95-3 are configured and implemented in a manner similar to that described above with reference to FIG. 6 to pass updated configuration data SWR_DATA, HWR_DATA and AHB_WDATA to register 90 during update operations performed during normal operation of IC device 80D. Register input control circuitry 98D includes a normal operation control circuit 98D-1 that is configured to generate register input control signals RIC in a manner described above. Fault detection circuit 100D includes parity multiplexer 180, parity calculator circuit 122, parity register 124, comparator 140D, detection enable circuit 160D, and output drive 170D that are configured and operate during parity update mode and parity validation mode operations essentially as described above. For brevity, details regarding the construction and operation of these circuit structures are incorporated from above and omitted below.

IC device 80D differs from the previous embodiments in that it is operably configured to implement a self-test procedure during which detection enable circuit 160D is "overridden" such that output driver control signal ERR_EN remains asserted when one or more of register input control signals RIC are asserted. The self-test procedure is controlled by a self-test control circuit 98D-2, which in one embodiment is implemented as part of the register control circuitry 98D but may be implemented at other locations, and by additional system components like the processor and/or dedicated self-test manager circuitry (not shown) that shares an associated system bus (e.g., the AHB system bus used to transmit data AHB_WDATA in FIG. 7) with the processor, and is operably configured to transmit self-test data onto the associated bus lines. Self-test control circuit 98D-2 is configured to assert a self-test control signal STEST=1 during self-test procedure time periods, and to de-assert self-test control signal STEST=0 during normal operation time periods (i.e., during configuration update and parity validation mode operations). The self-test procedure is also controlled in part by detection enable circuit 160D, which includes a logic-NOR gate 162 configured to assert data source selection control signal DSSEL when all three register input control signals RIC are de-asserted, and to de-assert data source selection control signal DSSEL when at least one of register input control signals RIC is asserted, and a logic-OR gate 164 configured to assert output driver control signal ERR-EN when either data source selection control signal DSSEL or self-test control signal STEST is asserted, and to de-assert output driver control signal ERR-EN when both of data source selection control signal DSSEL and self-test control signal STEST is de-asserted.

IC device 80D is selectively controlled to perform the self-test procedure when the integrity of the parity generation and parity check circuitry needs to be tested. Parity errors can be generated in the self-test procedure, and parity bit values can be updated in this mode, for example by way of transmitting self-test configuration data bytes by way of register input multiplexer 95-1 onto register input signal lines RB-IN. In one exemplary embodiment, a first self-test configuration data byte having an even parity is transmitted to parity calculator 122, and the resulting even parity bit is stored in parity register 124. A second self-test configuration data byte having an odd parity is then transmitted to parity calculator 122 by causing control signal RIC-SWR to be asserted, which causes the de-assertion of data source selection control signal DSSEL. The even parity stored in parity register 124 differs from the odd parity generated at the output of parity calculator 122, whereby comparator 140D asserts mismatch signal MISMATCH. During normal operation, the de-assertion of data source selection control signal DSSEL also causes the de-assertion of output driver control signal ERR-EN, which prevents output driver 170D from asserting error signal ERR. However, due to the assertion of self-test control signal STEST, logic-OR gate 164 asserts output driver control signal ERR-EN, whereby output driver 170D asserts error signal ERR during the self-test procedure in response to the even/odd parity bits. Similar methods are used to prove even parity correctness by writing odd parity and then even parity data bytes. Additional self-test operations may be performed by way of utilizing different control signals and writing various patterns of even/odd self-test configuration data bytes.

As indicated near the top of FIG. 7, register input control circuit 98D must be modified to include self-test control circuit 98D-2 in order to implement the self-test procedure described above. That is, unlike the operation of the fault detection circuits described above embodiments set forth above, implementation of the self-test procedure requires modification of an IP/IC to include additional control circuitry (i.e., existing control circuitry is insufficient to perform the described self-test procedure). However, the higher level of protection provided by combining fault detection circuit 100D and the self-test procedure may justify the cost of including this additional control circuitry in critical circuits/devices, such as when IC device 80D is utilized in automotive, industrial, and aero-space systems. In one embodiment, the self-test procedure is performed on every register of host IC device 80D to ensure the correct operation of each fault detection circuit operably coupled to each register. In one embodiment, the self-test control signal STEST is driven by a dedicated configuration register field with triple redundancy protection.

Figure 8:
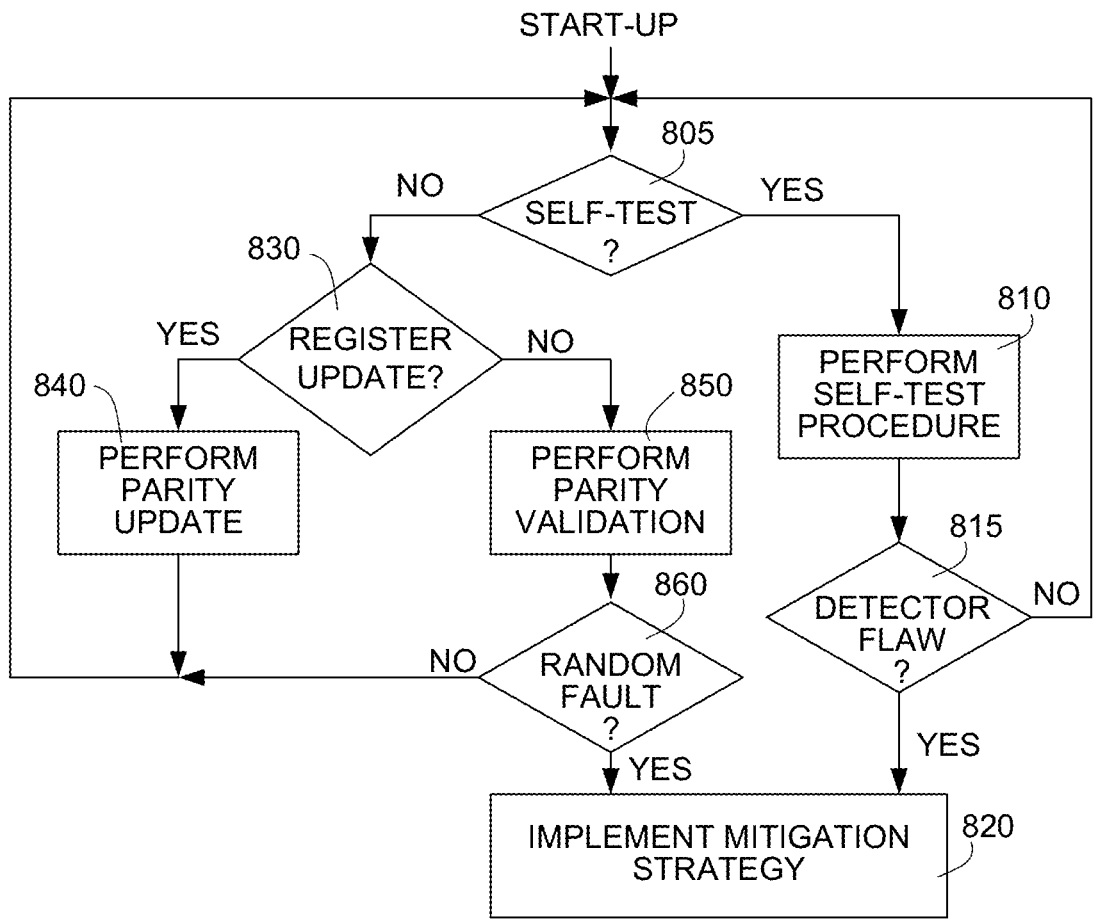
FIG. 8 is a flow diagram depicting a generalized operation process performed by the integrated circuit of FIG. 7.

FIG. 8 is a flow diagram showing the general operation of IC device 80D (FIG. 7) according to an exemplary embodiment. In this embodiment, the self-test procedure 810 is an external safety mechanism that is executed as part of a start-up routine performed by IC device 80D (e.g., during each ignition/key cycle of a vehicle), and may be optionally performed periodically during system operation (as indicated by the YES branch from decision block 805). Referring briefly to FIG. 7, during the self-test procedure register input multiplexer 95-1 is controlled to pass self-test data bytes from a self-test data source (not shown) onto register input signal lines RB-IN. Referring again to FIG. 8, when the self-test procedure detects a flaw in one or more fault detector circuits (YES branch from decision block 815), control is passed to a mitigation circuit (block 820) for implementation of an appropriate corrective action, whereupon control may be returned to the start-up operating phase. When the self-test procedure fails to detect a flaw in one or more fault detector circuits (NO branch from block 815), normal operation of IC device 80D is initiated (i.e., control passes back to block 805, and along the NO branch from block 805 to block 830). Blocks 830, 840 and 850 depict the normal operation of IC device 80D in either the parity update mode or the parity validation mode, which are performed as described above. That is, each parity update mode operation is performed, for example, when one of register input control signals RIC-HWR and RIC-SWR (FIG. 7) is asserted, and control passes along the YES branch from block 830 to block 840. Conversely, in the absence of a register update (e.g., when register input control signals RIC-HWR and RIC-SWR (FIG. 7) are de-asserted), control passes along the NO branch from block 830 to block 850, and parity validation is performed until a new register update is received. When a random hardware fault is detected during parity validation mode operations (YES branch from block 860), control passes to mitigation circuit (block 820) for implementation of an appropriate corrective action.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. An integrated circuit device including:
a mapped register configured to store data bit values that are operably received on a plurality of register input signal lines, and to transmit said stored data bit values on a plurality of register output signal lines;
register control circuitry configured to transfer updated data onto said plurality of register input signal lines in response to one or more register input control signals such that said data bit values are overwritten by said updated data when at least one of said register input control signals is asserted, and such that said data bit values retain said updated data when all of said one or more register input control signals are subsequently de-asserted; and
a fault detection circuit configured to assert a fault detection signal when a random hardware fault is detected in said mapped register, wherein said fault detection circuit comprises:
a parity bit-pair generator coupled to said plurality of register output signal lines and configured to sequentially generate a plurality of parity bit pairs such that a first parity bit of said each parity bit pair is generated during a first clock cycle of a system clock signal and a second parity bit of said each parity bit pair is generated during a subsequent second clock cycle of said system clock signal, said first parity bit being generated with a first bit value having first logic level when said stored data bit values define an even parity during said first clock cycle, said first bit value and having a second logic level when said plurality of register data bit values define an odd parity during said first clock cycle, said second parity bit being generated with a second bit value having said first logic level when said data bit values defined an even parity during a second said clock cycle, said second bit value having said second logic level when said data bit values define an odd parity during said second clock cycle;
a comparator configured assert a mismatch signal when said first bit value of said first parity bit differs from said second bit value of said second parity bit, and configured to de-assert said mismatch signal when said first bit value matches said second bit value;
a detection enable circuit configured to assert an output driver control signal when all of said one or more register input control signals are de-asserted and to de-assert said output driver control signal when at least one of said register input control signals is asserted; and
an output driver configured to assert said fault detection signal when both said mismatch signal and said output driver control signal are asserted.

2. The integrated circuit device of claim 1, wherein the parity bit-pair generator comprises:
a parity calculator circuit having input terminals coupled to the plurality of register output signal lines and being configured to generate said second parity bit such that said second parity bit is transmitted on an output terminal of said parity calculator circuit during said second clock cycle, and
a parity register having an input terminal connected to the output terminal of the parity calculator circuit and being configured to transmit said first parity bit on an output terminal during said second clock cycle; and
wherein the comparator comprises a first logic gate having a first input terminal connected to the output terminal of the parity calculator, a second input terminal connected to the output terminal of the parity register, and an output terminal coupled to the output driver.

3. The integrated circuit device of claim 2, wherein the parity register comprises a flip-flop configured to store said first parity bit during said second clock cycle, and to overwrite said first parity bit with said second parity bit during a third said clock cycle occurring subsequent to said second clock.

4. The integrated circuit device of claim 2, wherein the first logic gate comprises an exclusive-OR logic gate.

5. The integrated circuit device of claim 2,
wherein the detection enable circuit comprises a second logic gate having one or more input terminals operably coupled to said register control circuitry, said logic gate being configured to generate said output driver control signal on an output terminal, and wherein the output driver comprises a third logic gate having a first input terminal connected to the output terminal of the first logic gate and a second input terminal coupled to the output terminal of the second logic gate.

6. The integrated circuit device of claim 1, wherein the fault detection circuit further comprises a parity multiplexer including first input terminals connected to the plurality of register output signal lines, second input terminals connected to the plurality of register input signal lines, output terminals connected to the input terminals of the parity bit-pair generator, and wherein said parity multiplexer is controlled by a data source selection control signal such that said parity bit-pair generator is operably coupled to receive said stored data bit values transmitted on said plurality of register output signal lines when said data source selection control signal is de-asserted, and is operably coupled to receive updated data transmitted on said plurality of register input signal lines when said data source selection control signal is asserted.

7. The integrated circuit device of claim 6, wherein said detection enable circuit is further configured to assert said data source selection control signal when all of said one or more register input control signal are de-asserted, and to de-assert said data source selection control signal when at least one of said one or more register input control signals is asserted.

8. The integrated circuit device of claim 1, wherein the register control circuitry comprises:
one or more multiplexers configured to couple said register input signal lines to an associated selected source when an said associated register input control signal is asserted, and to couple said register input signal lines to said register output lines when all of said associated register input control signals is de-asserted; and
a register input control circuit configured to assert one of said associated register input control signals during a parity update mode operation by way of generating said asserted associated register input control signal as a logic-1 signal value, said register input control circuit also being configured to de-assert all of said associated register input control signals during a parity validation mode operation by way of generating all of said de-asserted associated register input control signals as logic-0 signal values.

9. The integrated circuit device of claim 8, wherein the detection enable circuit comprises a logic gate having a plurality of input terminals respectively connected to an associated said register input control signal, and an output terminal operably coupled to said output driver.

10. The integrated circuit device of claim 9, wherein the fault detection circuit further comprises a parity multiplexer including first input terminals connected to the plurality of register output signal lines, second input terminals connected to the plurality of register input signal lines, output terminals connected to the input terminals of the parity bit-pair generator, and wherein said parity multiplexer is controlled by a data source selection control signal generated at said output terminal of said logic gate.

11. The integrated circuit device of claim 1, wherein the integrated circuit device further comprises a self-test control circuit configured to override said detection enable circuit such that said output driver control signal remains asserted when said one or more register input control signals are asserted.

12. The integrated circuit device of claim 11, wherein the self-test control circuit is implemented as part of the register control circuitry, and is configured to assert a self-test control signal during self-test procedure time periods, and to de-assert said self-test control signal during normal operation time periods.

13. The integrated circuit device of claim 12, wherein the detection enable circuit comprises:
a first logic gate configured to assert a data source selection control signal when all of said one or more register input control signals are de-asserted and to de-assert said data source selection control signal when at least one of said register input control signals is asserted; and
a second logic gate configured to assert said output driver control signal when at least one of said data source selection control signal and said self-test control signal is asserted, and to de-assert said output driver control signal when both of said data source selection control signal and said self-test control signal is de-asserted.

14. The integrated circuit device of claim 12, wherein the self-test control circuit is configured to perform a self-test procedure as part of a start-up routine of said integrated circuit device.

15. An integrated circuit device including:
a mapped register configured to store data bit values that are operably received on a plurality of register input signal lines in accordance with a system clock signal, and to transmit said stored data bit values on a plurality of register output signal lines;
register control circuitry configured to transfer updated configuration data onto said plurality of register input signal lines in response to one or more register input control signals such that said data bit values are overwritten by said updated data when at least one of said register input control signals is asserted, and such that said configuration data bit values retain said updated data when all of said one or more register input control signals are subsequently de-asserted; and
a fault detection circuit configured to assert a fault detection signal when a random hardware fault is detected in said mapped register, wherein said fault detection circuit comprises:
a parity multiplexer including first input terminals connected to the plurality of register output signal lines, second input terminals connected to the plurality of register input signal lines,
a parity calculator circuit having input terminals connected to output terminals of the parity multiplexer, said parity calculator circuit being configured to generate a sequence of parity bits such that one said parity bit is generated during each clock cycle of said system clock signal, such that each said parity bit has a first logic level when data bit values received from said parity multiplexer define an even parity, and such that said each parity bit has a second logic level when data bit values received from said parity multiplexer define an odd parity;
a parity register having an input terminal connected to an output terminal of the parity calculator circuit and being configured to store said sequence of parity bits such that said parity resister stores a first parity bit generated by said parity calculator circuit at a first said clock cycle of said system clock signal while a second parity bit is generated by said parity calculator circuit during a subsequent second clock cycle of said system clock signal;
a comparator configured assert a mismatch signal when a first bit value of said first parity bit differs from a second bit value of said second parity bit, and configured to de-assert said mismatch signal when said first bit value matches said second bit value;

a detection enable circuit configured to assert a data source selection control signal and an output driver control signal when all of said one or more register input control signals are de-asserted and to de-assert said data source selection control signal and said output driver control signal when at least one of said register input control signals is asserted; and an output driver configured to assert said fault detection signal only when said mismatch signal is asserted, wherein said parity multiplexer is controlled by said data source selection control signal such that said parity calculator circuit is operably coupled to receive said stored data bit values transmitted on said plurality of register output signal lines when said data source selection control signal is de-asserted, and is operably coupled to receive updated data transmitted on said plurality of register input signal lines when said data source selection control signal is asserted, and wherein said register control circuitry includes a self-test control circuit configured to override said detection enable circuit such that said output driver control signal remains asserted when said one or more register input control signals are either asserted or de-asserted.

* * * * *